US009016665B2

United States Patent
Lin et al.

(10) Patent No.: US 9,016,665 B2
(45) Date of Patent: Apr. 28, 2015

(54) HOIST HEALTH AND USAGE MONITORING SYSTEM AND COMPONENTS THEREOF

(75) Inventors: Chuang-Chia Lin, Diamond Bar, CA (US); Alan Leingang, Diamond Bar, CA (US); Dave Lopes, Fullerton, CA (US); Dennis Robertson, Huntington Beach, CA (US); Christopher M Sanden, Bloomington, MN (US); Odd Harald Steep Eriksen, Brooklyn Park, MN (US); Brian Snyder, Jordan, MN (US)

(73) Assignee: Goodrich Corporation, Charlotte, NC (US)

( * ) Notice: Subject to any disclaimer, the term of this patent is extended or adjusted under 35 U.S.C. 154(b) by 217 days.

(21) Appl. No.: 13/611,830

(22) Filed: Sep. 12, 2012

(65) Prior Publication Data

US 2014/0070153 A1 Mar. 13, 2014

(51) Int. Cl.
| | |
|---|---|
| B64D 9/00 | (2006.01) |
| B66D 1/54 | (2006.01) |
| G06F 11/30 | (2006.01) |
| H05K 13/00 | (2006.01) |
| B66C 1/40 | (2006.01) |
| G01L 1/14 | (2006.01) |
| G01L 5/10 | (2006.01) |
| B66D 1/58 | (2006.01) |

(52) U.S. Cl.
CPC .. *B64D 9/00* (2013.01); *B66D 1/54* (2013.01); *G06F 11/30* (2013.01); *H05K 13/0023* (2013.01); *Y10T 29/49117* (2015.01); *B66C 1/40* (2013.01); *G01L 1/142* (2013.01); *G01L 5/103* (2013.01); *B66D 1/58* (2013.01)

(58) Field of Classification Search
CPC .......... B66C 1/40; G01G 19/18; G01L 1/142; G01L 5/103; G06F 11/30; G06F 11/3065; G06F 11/3089; B64D 9/00; B66D 1/54; B66D 1/68
USPC .................................. 254/273–277, 266, 269
See application file for complete search history.

(56) References Cited

U.S. PATENT DOCUMENTS

| | | | |
|---|---|---|---|
| 8,189,300 B1 * | 5/2012 | Bonin | 360/290 |
| 2008/0190210 A1 | 8/2008 | Harish et al. | |
| 2009/0183579 A1 | 7/2009 | Abe | |
| 2010/0224117 A1 * | 9/2010 | Christensen et al. | 114/253 |
| 2011/0001437 A1 * | 1/2011 | Marcaccio et al. | 315/294 |

OTHER PUBLICATIONS

"MFR/MFR2—Powerful, scalable single module data acquisition solution", Multi-Function Recorders, Stack Limited 2011, 2 pages.

* cited by examiner

*Primary Examiner* — Emmanuel M Marcelo
*Assistant Examiner* — Angela Caligiuri
(74) *Attorney, Agent, or Firm* — Locke Lord LLP; Scott D. Wofsy; Christopher J. Cillié

(57) ABSTRACT

Health and usage monitoring systems for aircraft hoist systems are described herein. In some embodiments, a health and usage monitoring system comprises a capacitive load cell and a processing unit for communication with the capacitive load cell, the capacitive load cell comprising a load receiving surface and a capacitive assembly coupled to the load receiving surface, the capacitive assembly comprising parallel electrically conductive plates separated by a reversibly deformable spacer construction wherein the parallel plates comprise aligned apertures providing a passageway through the capacitive assembly for the hoist system cable.

28 Claims, 7 Drawing Sheets

HOIST HEALTH AND USAGE MONITORING SYSTEM AND COMPONENTS THEREOF

FIELD

The present invention relates to health and usage monitoring systems and, in particular, to health and usage monitoring systems for aircraft hoist systems.

BACKGROUND

Aircraft hoist systems comprising a hook and cable assembly coupled to a cable winding and unwinding apparatus are used in critical applications including rescue missions by armed forces, police, firefighters, medical evacuation crews and other municipal personnel. Given the use of aircraft hoist systems in such applications, it is necessary to inspect and maintain the hoist system on a regular basis. Current inspection methods include visual inspection of the cable for various defects such as strand fraying, pitting and crushing as well as strands and wires breakage. In some cases, various support apparatus are used for the assessment of cable condition. Optical and/or magnetic diagnostic apparatus have been developed for the evaluation of cable strand condition.

Inspection of the cable can be labor intensive as the cable must be unwound and properly reeled after inspection. It is often necessary to pretension the cable during the reeling process to avoid the occurrence of irregular wraps.

While useful for generally determining cable condition, current inspection methods do not provide direct information regarding specific operating events experienced by aircraft hoist systems, including cable loadings, cable shocks and exposure to over limit conditions. Such information is useful to the maintenance and care of aircraft hoist systems, potentially increasing system lifetime and safety.

SUMMARY

Health and usage monitoring systems for aircraft hoist systems are described herein. In some embodiments, health and usage monitoring systems described herein are operable to provide direct information regarding specific operating events experienced by aircraft hoist systems, including cable loadings, cable shocks and exposure to over limit conditions. Additionally, components for hoist health and usage monitoring systems are described herein. In some embodiments, the components assist in the acquisition of data related to the operational conditions and parameters of an aircraft hoist system for subsequent review by an end user.

In one aspect, a capacitive load cell is described herein. A capacitive load cell, in some embodiments, comprises a load receiving surface and a capacitive assembly coupled to the load receiving surface, the capacitive assembly comprising parallel electrically conductive plates separated by a reversibly deformable spacer construction, wherein the plates comprise aligned apertures providing a passageway through the capacitive assembly. In some embodiments, the aligned apertures provide a passageway for the cable of an aircraft hoist system through the assembly. Further, in some embodiments, the reversibly deformable spacer construction has an elastic modulus rendering a change in spacing of the parallel electrically conductive plates under an applied load in a first load region resulting in a measurable change in capacitance of the capacitive assembly.

In another aspect, a health and usage monitoring system described herein comprises a capacitive load cell and a processing unit for communication with the capacitive load cell, the capacitive load cell comprising a load receiving surface and a capacitive assembly coupled to the load receiving surface, the capacitive assembly comprising parallel electrically conductive plates separated by a reversibly deformable spacer construction wherein the parallel plates comprise aligned apertures providing a passageway through the capacitive assembly for the hoist system cable. In some embodiments, the capacitive load cell of the health and usage monitoring system comprises apparatus for recording and transmitting data related to load measured by the capacitive load cell.

In another aspect, aircraft hoist systems are described herein. An aircraft hoist system, in some embodiments, comprises a cable coupled to a cable winding and unwinding apparatus, a hook coupled to the cable through an interface assembly comprising a hook bumper and striker plate and a health and use monitoring system comprising a load cell and a processing unit for communication with the load cell, wherein the load cell is positioned in a load path through the interface assembly. In some embodiments, the load cell is positioned between the striker plate and the hook bumper of the interface assembly. In some embodiments, the load cell is a capacitive load cell comprising a load receiving surface and a capacitive assembly coupled to the load receiving surface, the capacitive assembly comprising parallel electrically conductive plates separated by a reversibly deformable spacer construction wherein the parallel plates comprise aligned apertures providing a passageway through the capacitive assembly for the hoist system cable.

In another aspect, methods of fitting a health and usage monitoring system to an aircraft hoist system are described herein. In some embodiments, a method of fitting a health and usage monitoring system to an aircraft hoist system comprises positioning a load cell in a load path through a cable-hook assembly of the aircraft hoist system. In some embodiments, the load cell is positioned between a striker plate and hook bumper of the cable-hook assembly. A processing unit for communication with the load cell is provided and coupled to the aircraft hoist system. In some embodiments, the load cell is a capacitive load cell comprising a load receiving surface and a capacitive assembly coupled to the load receiving surface, the capacitive assembly comprising parallel electrically conductive plates separated by a reversibly deformable spacer construction, wherein the parallel plates comprise aligned apertures providing a passageway through the capacitive assembly for the hoist system cable. In some embodiments, the aircraft hoist system is an existing system, and the fitting is a retrofitting of the health and usage monitoring system to the existing aircraft hoist system.

In a further aspect, methods of monitoring the health and usage of an aircraft hoist system are described herein. In some embodiments, a method of monitoring health and usage of an aircraft hoist system comprises measuring cable load with a load cell positioned in a load path through a cable-hook assembly of the aircraft hoist system. In some embodiments, the load cell is positioned between a striker plate and hook bumper in the cable-hook assembly. In some embodiments, the load cell comprises a capacitive load cell comprising a load receiving surface and a capacitive assembly coupled to the load receiving surface, the capacitive assembly comprising parallel electrically conductive plates separated by a reversibly deformable spacer construction wherein the parallel plates comprise aligned apertures providing a passageway through the capacitive assembly for the hoist system cable.

DETAILED DESCRIPTION

Embodiments described herein can be understood more readily by reference to the following detailed description and examples and their previous and following descriptions. Elements, apparatus and methods described herein, however, are not limited to the specific embodiments presented in the detailed description and examples. It should be recognized that these embodiments are merely illustrative of the principles of the present invention. Numerous modifications and adaptations will be readily apparent to those of skill in the art without departing from the spirit and scope of the invention.

Health and usage monitoring systems for aircraft hoist systems are described herein. In some embodiments, the health and usage monitoring systems are operable to provide direct information regarding specific operating events experienced by aircraft hoist systems, including cable loadings, cable shocks and exposure to over limit conditions. Additionally, components for hoist health and usage monitoring systems are described herein. In some embodiments, the components assist in the acquisition of data related to the operational conditions and parameters of an aircraft hoist system for subsequent review by an end user.

I. Capacitive Load Cell

A capacitive load cell described herein, in some embodiments, comprises a load receiving surface and a capacitive assembly coupled to the load receiving surface, the capacitive assembly comprises parallel electrically conductive plates separated by a reversibly deformable spacer construction, wherein the plates comprise aligned apertures providing a passageway through the capacitive assembly. In some embodiments, the aligned apertures provide a passageway for the cable of an aircraft hoist system through the assembly.

Turning now to specific components, a capacitive load cell described herein comprises a capacitive assembly comprising parallel electrically conductive plates separated by a reversibly deformable spacer construction, wherein the plates comprise aligned apertures providing a passageway through the capacitive assembly. The parallel electrically conductive plates can comprise any construction not inconsistent with the objectives of the present invention. In some embodiments, an electrically conductive plate is a self-supporting sheet of any electrically conductive material. In some embodiments, for example, an electrically conductive plate is a metal sheet. Alternatively, in some embodiments, an electrically conductive plate is a sheet of electrically conductive polymeric material. A metal sheet or electrically conductive polymeric sheet for use as a capacitor plate in the capacitive assembly, in some embodiments, demonstrates mechanical integrity sufficient to maintain parallel arrangement with an opposing capacitive plate in the assembly during loading and operation of the capacitive assembly.

In some embodiments, a metal sheet or electrically conductive polymeric sheet is coupled or deposited on a substrate. The substrate, in some embodiments, demonstrates mechanical integrity sufficient to maintain parallel arrangement of the electrically conductive sheet with other capacitive plates in the assembly during loading and operation of the capacitive assembly. In some embodiments wherein a substrate is used, the metal sheet or electrically conductive polymeric sheet is not self-supporting and can be deposited on the substrate as a film. A substrate can comprise any construction not inconsistent with the objectives of the present invention. In some embodiments, a substrate comprises a thermoplastic or a thermoset. Thermoplastics, in some embodiments, include polyolefins, polyacrylates, polycarbonates, polyesters or polyamides or mixtures thereof. Thermosets, in some embodiments, comprise epoxides, polyimides or cross-linked isocyanates or mixtures thereof. A polymeric substrate of a capacitive plate, in some embodiments, comprises one or more reinforcing agents such as glass fibers, carbon fibers or ceramic fibers. In some embodiments, a substrate comprises printed circuit board (PCB). For example, in one embodiment, a substrate having an electrically conductive film or sheet deposited thereon is FR-4.

The electrically conductive film or sheet, in some embodiments, completely covers the surface of the substrate on which film or sheet is deposited. In some embodiments, the electrically conductive film or sheet only covers a portion of the substrate surface on which the film or sheet is deposited.

As described herein, the electrically conductive plates comprise aligned apertures providing a passageway through the capacitive assembly. In some embodiments, each electrically conductive plate of the capacitive assembly comprises an aperture centered on the plate. Aligned apertures of electrically conductive plates can have any diameter not inconsistent with the objectives of the present invention. In some embodiments, the aligned apertures have a diameter sufficient to pass a cable of an aircraft hoist system.

The electrically conductive plates can have any desired shape. In some embodiments, the electrically conductive plates are annular or elliptical. The electrically conductive plates, in some embodiments, are polygonal such as square, rectangular, hexagonal or octagonal.

The capacitive assembly also comprises a reversibly deformable spacer construction separating the electrically conductive plates. The reversibly deformable spacer construction can have any architecture not inconsistent with the objectives of the present invention. In some embodiments, the reversibly deformable spacer construction has an elastic modulus rendering a change in spacing of the parallel electrically conductive plates under an applied load in a first load range resulting in a measurable change in capacitance of the capacitive assembly. The first load range, in some embodiments, is from about 10 pounds to about 2500 pounds. In some embodiments, the first load range is from about 100 pounds to about 2500 pounds. In some embodiments, the first load range is less than 10 pounds or greater than 2500 pounds. In some embodiments, for example, wherein the load cell is employed in a winch system, the first load range is greater than 2500 pounds. The first load range, in some embodiments, is greater than 5000 pounds, greater than 7500 pounds or greater than 10,000 pounds. In being reversibly deformable, the spacer construction, in some embodiments, does not demonstrate permanent deformation or creep resulting from load cycling.

The reversibly deformable spacer construction, in some embodiments, comprises a monolithic dielectric material positioned between the electrically conductive plates. The monolithic dielectric material has an elastic modulus rendering a change in spacing of the parallel electrically conductive plates under an applied load in a first load range resulting in a measurable change in capacitance of the capacitive assembly. In some embodiments, suitable dielectric materials comprise polymeric species including polyolefins, polyacrylates, polycarbonates, polyesters polyamides, elastomers or fluoropolymers or mixtures thereof. In some embodiments, for example, the dielectric material comprises polyethylene, polytetrafluoroethylene (PTFE) or polyvinylidene fluoride (PVDF). In some embodiments, the dielectric material comprises a poly 1,3-diene or alkyl polysiloxane, such as polydimethylsiloxane (PDMS).

Figure 1:
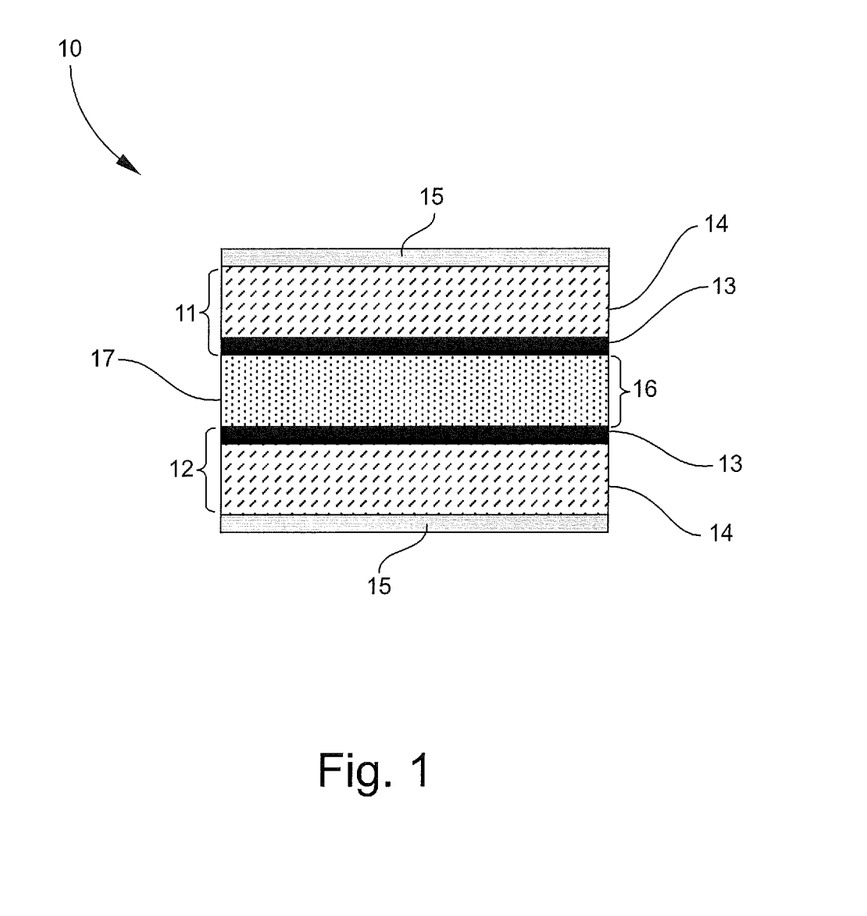
FIG. 1 illustrates a cross-sectional view of a capacitive assembly according to one embodiment described herein.

FIG. 1 illustrates a cross-sectional view of a capacitive assembly having a monolithic dielectric material positioned between electrically conductive plates according to one embodiment described herein. As illustrated in FIG. 1, electrically conductive plates (11, 12) of the capacitive assembly (10) comprise an electrically conductive film (13) coupled to an electrically insulating substrate (14) of sufficient mechanical integrity to maintain parallel arrangement of the conductive plates (11, 12) during loading of the capacitive assembly (10). In the embodiment of FIG. 1, metallic shielding layers (15) are provided on the top and bottom surfaces of the capacitive assembly (10) for the control of fringe fields or stray capacitance. A reversibly deformable spacer construction (16) of a dielectric material (17) is positioned between the electrically conductive plates (11, 12).

Figure 2A:
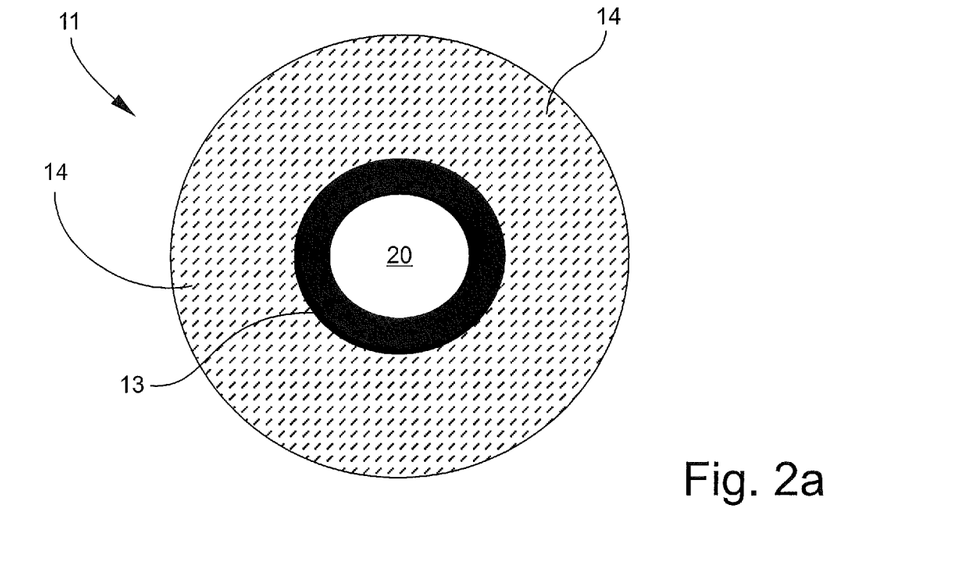
FIG. 2a illustrates a bottom plan view of an electrically conductive plate of a capacitive assembly according to one embodiment described herein.

With reference to FIG. 2a, the substrate (14) and electrically conductive film (13) of the conductive plate (11) are annular having an aperture (20). The aperture (20) can have any desired diameter, including a diameter suitable for providing passage of a hoist cable through the capacitive assembly. As illustrated, the lateral surface area of the electrically conductive film (13) is not coextensive with the lateral surface area of the substrate (14). The lateral surface area of the electrically conductive film (13) can be varied in embodiments described herein according to considerations including, but not limited to, the desired initial capacitance of the capacitive assembly, the desired size of the capacitive assembly and/or the desired sensitivity of the capacitive assembly to applied loads.

Figure 2B:
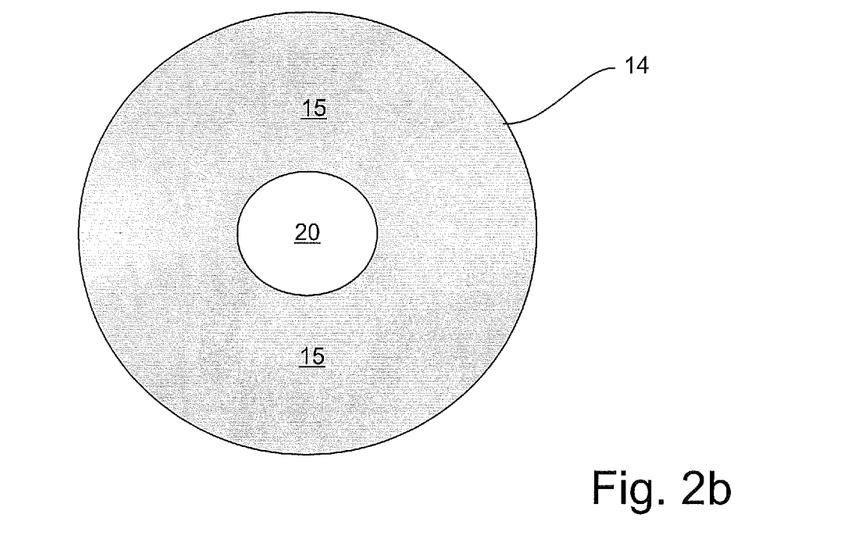
FIG. 2b illustrates a top plan view of an electrically conductive plate of a capacitive assembly according to one embodiment described herein.

With reference to FIG. 2b, the metallic shielding layer (15) is deposited on the opposing side of the substrate (14). In the present embodiment, the metallic shielding layer (15) is coextensive with the surface area of the substrate (14).

In some embodiments, the reversibly deformable spacer construction comprises columns of dielectric material positioned between the electrically conductive plates, as opposed to the foregoing monolithic element. The collection of dielectric columns provides the spacer construction an elastic modulus rendering a change in spacing of the parallel electrically conductive plates under an applied load in a first load range resulting in a measurable change in capacitance of the capacitive assembly. The columns can comprise any dielectric material described herein.

Figure 3:
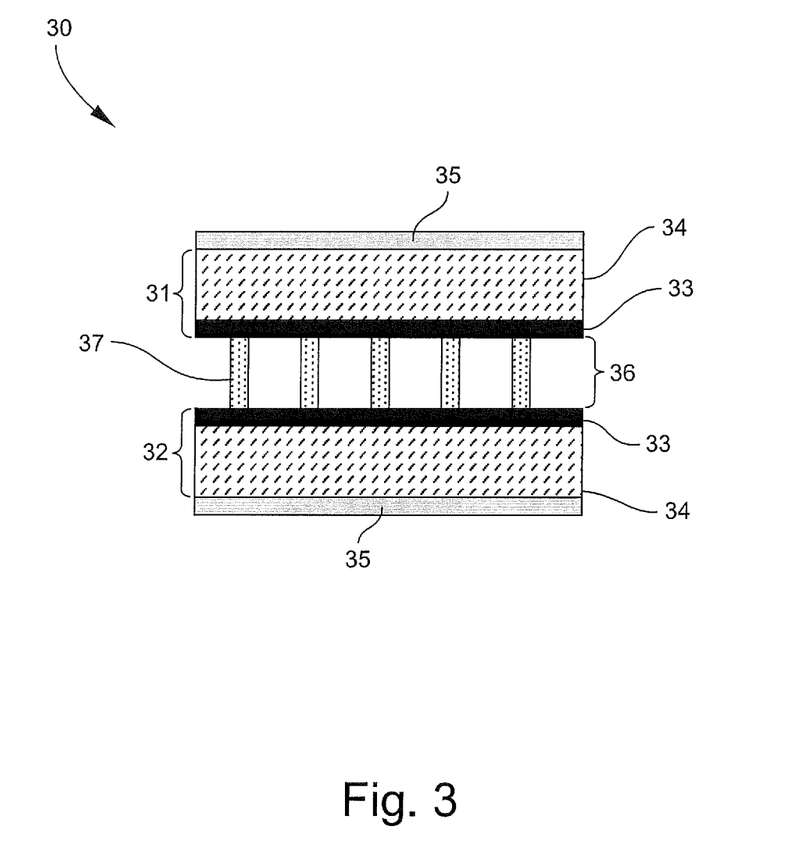
FIG. 3 illustrates a cross-sectional view of a capacitive assembly according to one embodiment described herein.

FIG. 3 illustrates a cross-sectional view of a capacitive assembly according to one embodiment described herein. As illustrated in FIG. 3, electrically conductive plates (31, 32) of the capacitive assembly (30) comprise an electrically conductive film (33) coupled to a substrate (34) of sufficient mechanical integrity to maintain parallel arrangement of the conductive plates (31, 32) during loading of the capacitive assembly (30). Metallic shielding layers (35) are provided on the top and bottom surfaces of the capacitive assembly (30). A reversibly deformable spacer construction (36) of dielectric columns (37) is positioned between the electrically conductive plates (31, 32).

In some embodiments, the electrically conductive plates (31, 32) have an architecture consistent with that illustrated in FIG. 2a and FIG. 2b. In such embodiments, columns (37) of the reversibly deformable spacer construction (36) can be positioned outside the ring of electrically conductive film (33). When positioned outside the ring of electrically conductive film(33), columns (37) of the reversibly deformable spacer construction (36) are not required to be constructed of a dielectric material. In some embodiments, the columns (37) are constructed of a metallic or semiconducting material.

Further, in some embodiments, the reversibly deformable spacer construction comprises springs positioned between the electrically conductive plates. Any desired number of springs can be used to provide the spacer construction with an elastic modulus rendering a change in spacing of the parallel electrically conductive plates under an applied load in a first load range resulting in a measurable change in capacitance of the capacitive assembly. In some embodiments, springs are constructed of a metal or crystalline material free or substantially free of creep or permanent deformation from load cycling. In some embodiments wherein the reversibly deformable spacer construction comprises springs, the electrically conductive plates of the capacitive assembly having an architecture as illustrated in FIG. 2a and FIG. 2b. In such embodiments, springs of the reversibly deformable spacer construction can be positioned outside the ring of electrically conductive film. In one embodiment, for example, a support ring is coupled to the substrate surface of each plate outside the electrically conductive film, and the springs are coupled to the support rings to provide the reversibly deformable spacer construction.

Figure 7:
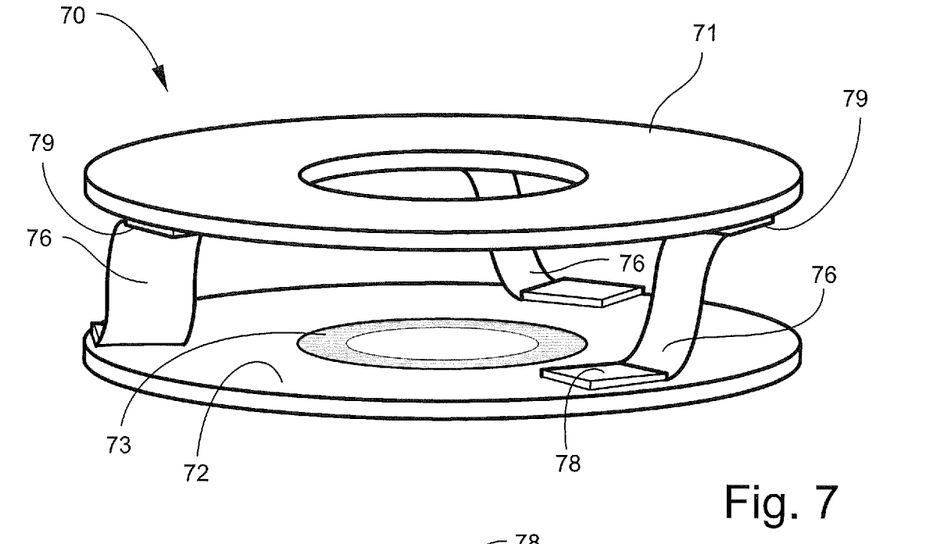
FIG. 7 illustrates a perspective view of a capacitive assembly according to one embodiment described herein.

FIG. 7 illustrates a perspective view of a capacitive assembly wherein the reversibly deformable spacer construction comprises springs positioned between the electrically conductive plates according to one embodiment described herein. As illustrated in FIG. 7, the springs (76) of the capacitive assembly (70) are positioned between the electrically conductive plates (71, 72) and coupled to the plates by bottom (78) and top (79) anchors. The electrically conductive plates (71, 72) can have a construction consistent with that provided in FIGS. 1 and 2 herein and the springs (76) are positioned outside the ring of electrically conductive film (73).

Figure 8:
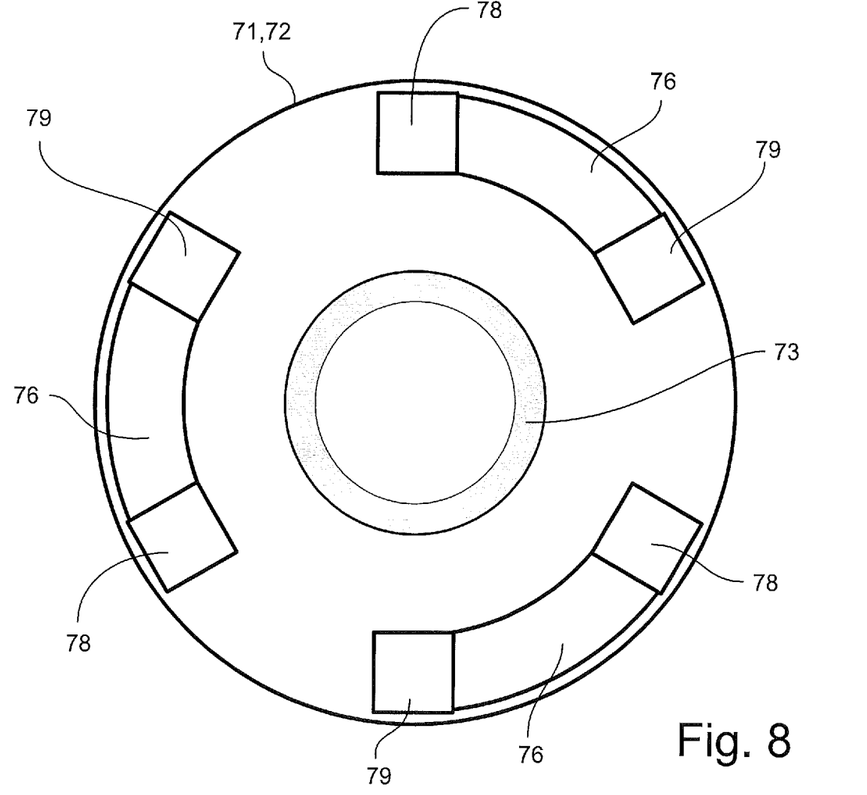
FIG. 8 illustrates a top cut-away view of a capacitive assembly according to one embodiment described herein.

FIG. 8 illustrates a top cut-away view of a capacitive assembly of FIG. 7. As illustrated in FIG. 8, the springs (76) are positioned outside the ring of electrically conductive film (73) of the electrically conductive plates (71, 72).

Figure 9:
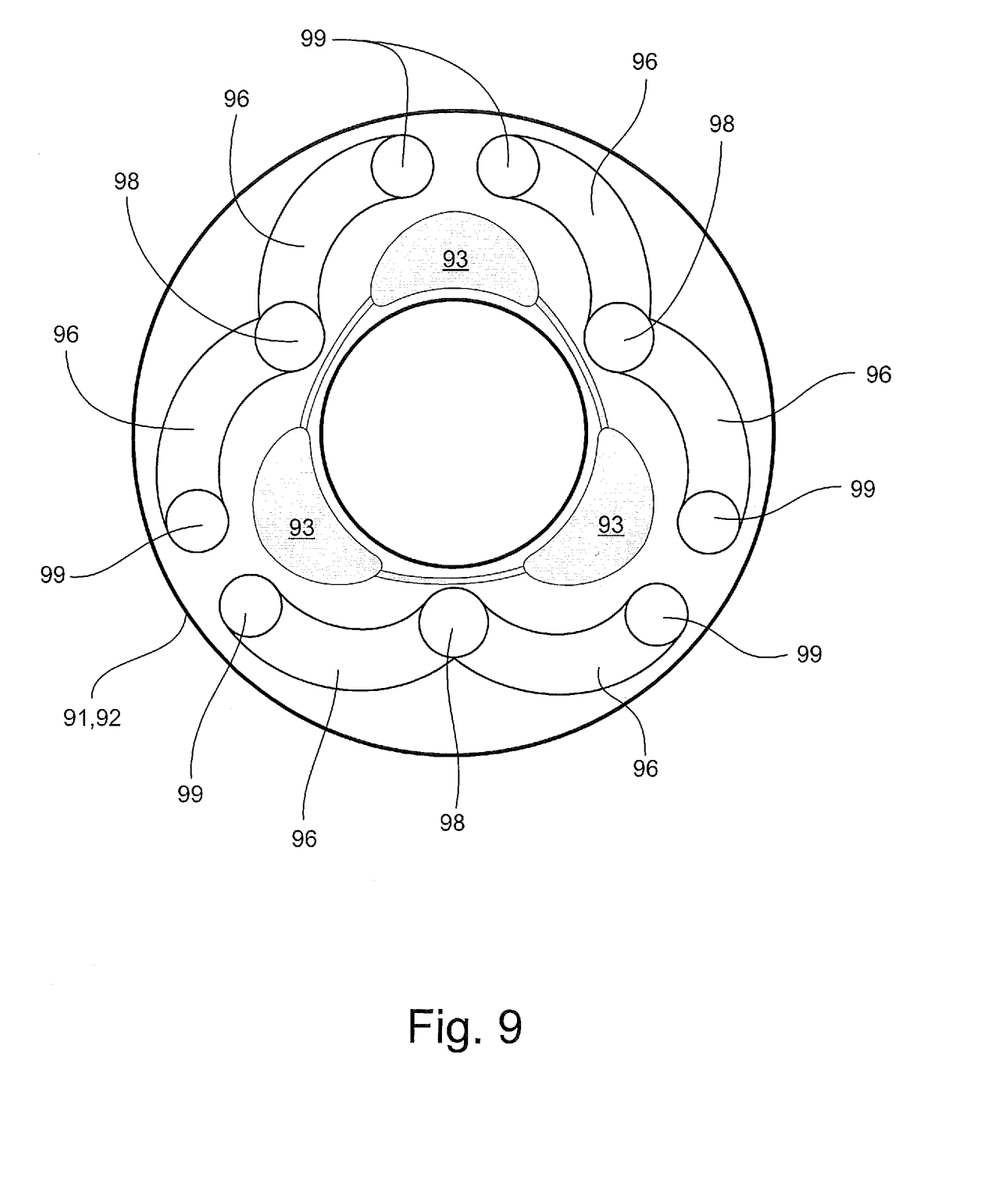
FIG. 9 illustrates a top cut-away view of a capacitive assembly according to one embodiment described herein.

FIG. 9 illustrates a top cut-away view of a capacitive assembly wherein the reversibly deformable spacer constructions comprises springs positioned between the electrically conductive plates according to one embodiment described herein. The springs (96) are positioned outside the electrically conductive areas (93) of the capacitive plates (91, 92). The springs (96) are coupled to common anchors (98) on conductive plate (91) and coupled to independent anchors (99) on the opposing conductive plate (92).

Additionally, in some embodiments, the reversibly deformable spacer construction comprises a housing to which the electrically conductive plates are coupled. In such embodiments, deformation of the housing by an applied load alters the spacing of the electrically conductive plates, thereby rendering a change in capacitance of the capacitive assembly. The housing, therefore, can demonstrate any desired construction having an elastic modulus rendering a change in spacing of the parallel electrically conductive plates under an applied load in a first load range. In some embodiments, the housing is constructed of a polymeric material. Suitable polymeric materials can comprise any of the polymeric materials described herein. In some embodiments, the housing is constructed of a ceramic or metal.

A capacitive assembly, in some embodiments, comprises two electrically conducive plates. Alternatively, a capacitive assembly can comprise more than two electrically conductive plates in a stacked configuration, wherein reversibly deformable spacer constructions described herein are positioned between the plates.

A capacitive assembly, in some embodiments, is sectioned to provide a plurality of discrete capacitive subassemblies, each operable to demonstrate a measurable change in capacitance under an applied load in a first load range as described herein. In one embodiment, a capacitive assembly having a construction as illustrated in FIGS. 1 and 2 is sectioned to provide a plurality of discrete capacitive subassemblies. The annular electrically conductive plates and monolithic dielectric element positioned therebetween, for example, are sectioned into quadrants wherein each quadrant is a discrete capacitive subassembly operable to register a measurable change in capacitance under an applied load. As discussed further herein, sectioning the capacitive assembly into subassemblies can assist in detecting off-axis or non-uniform loads applied to an aircraft hoist system.

A capacitive assembly described herein can have any desired value of initial capacitance based on structural factors including area of the electrically conductive plates, separation distance of the plates in the unloaded state and compositional identity of the reversibly deformable spacer construction. Initial capacitance, as used herein, refers to the capacitance of the capacitive assembly in the unloaded state. In some embodiments, the capacitive assembly has an initial capacitance according to Table I.

TABLE I

| Initial Capacitance of Capacitive Assembly Capacitance (pF) |
| --- |
| 1-50 |
| 1-30 |
| 1-20 |
| 1-10 |
| 0.5-5 |
| 0.1-1 |

As described herein, the reversibly deformable spacer construction has an elastic modulus rendering a change in spacing of the parallel electrically conductive plates under an applied load in a first load range resulting in a measurable change in capacitance of the capacitive assembly. In some embodiments, a capacitive assembly demonstrates a change in capacitance according to Table II when subjected to an applied load in a first load range of 10-2500 pounds.

TABLE II

| Change in Capacitance of Capacitive Assembly Capacitance (fF) |
| --- |
| 1-30 |
| 1-20 |
| 1-10 |
| 1-5 |
| 1-3 |
| 0.5-5 |

Capacitance values provided by a capacitive load cell described herein can be correlated with applied load by calibration of the load cell. Calibration of the capacitive load cell, in some embodiments, comprises assigning load values to capacitance values through use of one or more calibration charts. In some embodiments, for example, a calibration chart comprises one or more load values associated with a capacitance value of the capacitive load cell. Assignation of load values to capacitance values of the load cell can be accomplished experimentally/empirically or theoretically. In some embodiments, for example, loads of known value are placed on a capacitive load cell described herein and at least one capacitance value for each load is provided by the capacitive load cell. In some embodiments, multiple capacitance values can be provided for each known load depending on the conditions under which the load is applied. For example, in some embodiments, multiple capacitance values are provided for an applied load based on varying temperatures at which the load is applied.

Alternatively, in some embodiments, an initial capacitance value is assigned to the capacitive load cell in the unloaded or rest state. A load of known value is placed on the capacitive load cell, and the change in capacitance from the initial value is determined. The value for the change in capacitance is assigned to the known load. A series of known loads can be applied to the capacitive load cell and the resulting changes in capacitate assigned to the known load in the establishment of a calibration chart. In some embodiments, multiple values for capacitance change can be provided for each known load depending on the conditions under which the load is applied, including environmental conditions such as temperature.

In some embodiments, calibration charts for capacitive load cells described herein are provided in electronic format for access by a processor of an apparatus incorporating the capacitive load cell, such as a health and usage monitoring system for an aircraft hoist system.

II. Health and Usage Monitoring System

In another aspect, health and usage monitoring systems for aircraft hoist systems are described herein. In some embodiments, a health and usage monitoring system comprises a capacitive load cell and a processing unit for communication with the capacitive load cell, the capacitive load cell comprising a load receiving surface and a capacitive assembly coupled to the load receiving surface, the capacitive assembly comprising parallel electrically conductive plates separated by a reversibly deformable spacer construction wherein the parallel plates comprise aligned apertures providing a passageway through the capacitive assembly for the hoist system cable. A capacitive load cell for a health and usage monitoring system described herein can have any construction and/or properties described in Section I hereinabove. In some embodiments, for example, the reversibly deformable spacer construction has an elastic modulus rendering a change in spacing of the parallel electrically conductive plates under an applied load in a first load region resulting in a measurable change in capacitance of the capacitive assembly.

The capacitive load cell of the health and usage monitoring system further comprises electronic apparatus for recording and/or storing load data measured by the cell. The capacitive load cell, for example, can comprise electronic memory to which load data is written and stored until the capacitive load cell is given a command to communicate the load data to the processing unit.

The capacitive load cell can communicate with the processing unit of the health in usage monitoring system through a variety of architectures. In some embodiments, the capacitive load cell comprises wireless data transmission and reception apparatus. Wireless data transmission and reception apparatus of the capacitive load cell, in some embodiments, operate with electromagnetic radiation in the UV, visible and/or infrared regions of the electromagnetic spectrum. Alternatively, in some embodiments, wireless data transmission and reception apparatus of the capacitive load cell operate with radio frequency radiation. For example, in some embodiments, wireless data transmission and reception apparatus of the capacitive load cell comprises infrared transceivers and/or radio frequency transceivers.

A capacitive load cell can comprise any number of wireless data transmission and reception apparatus for communication with the processing unit. In some embodiments wherein UV, visible or infrared transceivers are used, the capacitive load cell is required to have a line-of-sight arrangement with the processing unit for data communication. In such embodiments, the capacitive load cell can comprise multiple transceivers to obviate any orientation requirement of the capacitive load cell for establishing effective line-of-sight communication. For example, in one embodiment wherein the capacitive load cell demonstrates an annular geometry, infrared transceivers can be positioned along the circumference of the geometry, thereby precluding any specific rotational positioning of the load cell for establishing line-of-sight communication with the processing unit.

The capacitive load cell, in some embodiments, comprises a battery source for powering the data acquisition and recording circuitry as well as data communication apparatus. In some embodiments, the capacitive load cell is hard-wired to the processing unit. In such embodiments, wireless communication apparatus is unnecessary. Further, in such hard-wired embodiments, the capacitive load cell can draw power from the processing unit or device connected to the processing unit, rendering battery apparatus unnecessary.

As described further herein, a capacitive load cell, in some embodiments, has dimensions suitable for positioning between the striker plate and hook bumper of an aircraft hoist system cable-hook assembly. In being positioned between the striker plate and the hook bumper, the aligned apertures of the parallel electrically conductive plates of the capacitive assembly provide a passageway for the hoist cable. Therefore, the architecture of the cable-hook assembly is not altered to accommodate a health and usage monitoring system described herein.

The processing unit of the health and usage monitoring system can be embodied in a number of different ways. For example, the processing unit may be embodied as a processor, a microprocessor, a coprocessor, a controller or various other processing means or devices including integrated circuits such as, for example, an ASIC (application specific integrated circuit) or a FPGA (field-programmable gate array). The processing unit, in some embodiments, further comprises one or more interfaces for communication with an end user of the health and usage monitoring system and/or additional sensing apparatus of the aircraft hoist system including, but not limited to, temperature and cable footage sensors. The processing unit can further comprise electronic data storage apparatus for archiving raw or processed load data for subsequent access by an end user. In some embodiments, the electronic storage apparatus stores calibration data accessible to the processor when assigning load values to capacitance data communicated by the load cell.

The processing unit also comprises data transmission and reception apparatus compatible with the data transmission and reception apparatus of the capacitive load cell. The processing unit can comprise a single data transmission and reception apparatus or a plurality of data transmission and reception apparatus for communication with the load cell. As the processing unit can be coupled to a housing of the cable winding and unwinding apparatus of the aircraft hoist system, the processing unit, in some embodiments, does not demonstrate the orientational freedom or variability provided to the capacitive load cell by placement of the load cell between the striker plate and hook bumper of the cable-hook assembly. Therefore, the processing unit can often utilize fewer data transmission and reception apparatus for the establishment of line-of-sight communication with the capacitive load cell. In some embodiments, a bracket is provided for mounting the processing unit to a housing or other component of the aircraft hoist system.

The processing unit, in some embodiments, receives electrical power from the hoist system. For example, one or more electrical cables can be used for connection of the processing unit to the electrical power of the hoist system.

The health and usage monitoring system, in some embodiments, comprises one or more additional sensors. In some embodiments, for example, the monitoring system further comprises a cable footage sensor in communication with the processing unit. A cable footage sensor, in some embodiments, is a potentiometer. As described further herein, a cable footage sensor can permit the processing unit to determine the position of the cable-hook assembly and capacitive load cell relative to a home or rest position. Such positional information can be used by the processing unit for initiating or terminating data communication of between the processing unit and capacitive load cell. In some embodiments, the monitoring system further comprises a temperature sensor. The temperature sensor can be used to determine or estimate the temperature experienced by the capacitive load cell for selection of proper calibration data for assigning accurate load values.

Data acquired and processed by heath and usage monitoring systems described herein can assist end users in maintenance tracking, conditional awareness, over limit exposure and/or operating conditions of aircraft hoist systems. In some embodiments, for example, health and usage monitoring systems described herein can provide data related to one or more of cable loads, cable integrity, cable condition monitoring, need for cable maintenance, hoist vibration limits, operating temperature of various hoist system components, clutch slip and motor efficiencies as well as cycle counting.

III. Aircraft Hoist System

In another aspect, aircraft hoist systems are described herein. An aircraft hoist system, in some embodiments, comprises a cable coupled to a cable winding and unwinding apparatus, a hook coupled to the cable through an interface assembly comprising a hook bumper and striker plate and a health and use monitoring system comprising a load cell and a processing unit for communication with the load cell, wherein the load cell is positioned in a load path of the interface assembly. In some embodiments, the load cell is positioned between the striker plate and the hook bumper of the interface assembly. In some embodiments, hoist systems described herein are employed on helicopters.

Turning now to specific components, an aircraft hoist system described herein comprises a cable winding and unwinding apparatus. Typical cable winding and unwinding apparatus of aircraft hoist systems comprise a powered rotating drum around which the cable is wound. The cable winding and unwinding apparatus, in some embodiments, is positioned within a housing or frame for coupling to the aircraft.

Figure 4:
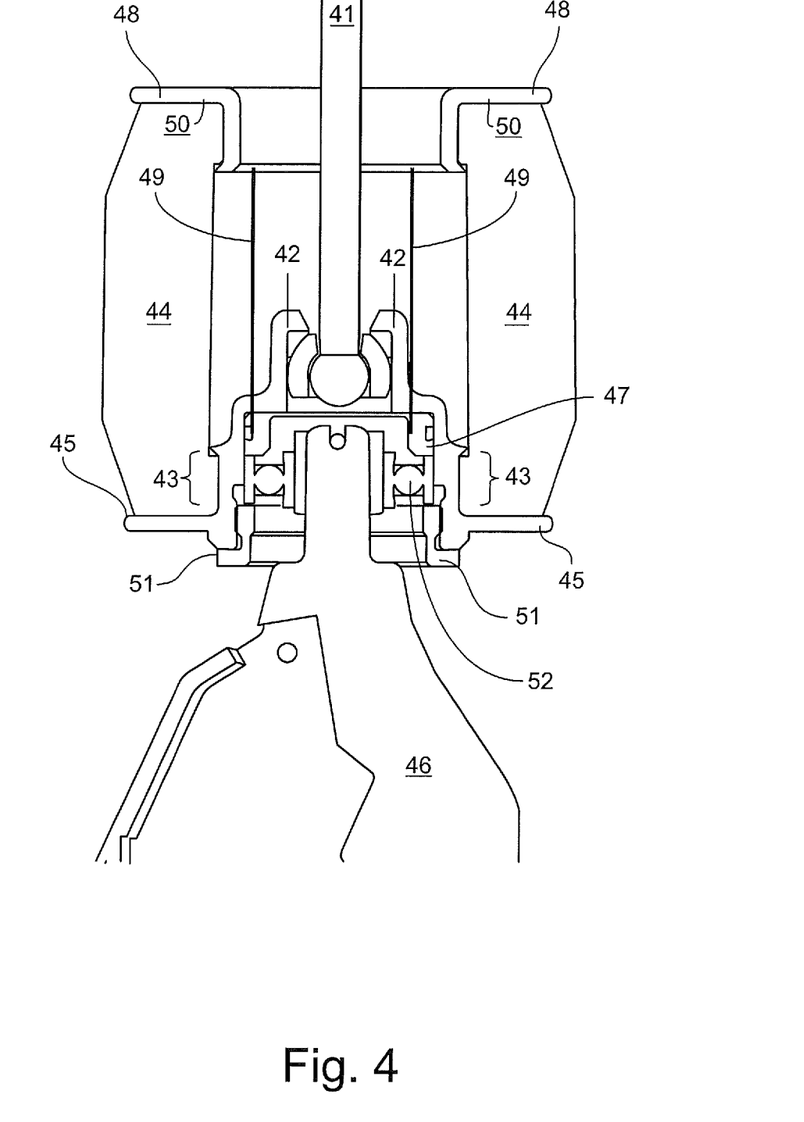
FIG. 4 illustrates a cross-section view of cable-hook interface assembly according to one embodiment described herein.

The hook of the aircraft hoist system is coupled to the cable through an interface assembly comprising a hook bumper and striker plate. FIG. 4 illustrates a cross-sectional view of a cable-hook interface assembly according to one embodiment described herein. As illustrated in FIG. 4, the cable (41) of the hoist system is secured by structural component (42) which interfaces with the lower region (43) of the hook bumper (44) and provides a base plate (45) for the hook bumper (44). The hook (46) is secured by structural component (47), wherein structural component (47) is coupled to the striker plate (48) by connectors (49). The hook structural component (47) is held to the base plate (45) by a retainer (51) through a bearing (52). Connectors (49) pass through structural component (42), wherein structural component (42) and structural component (47) are not directly connected and can demonstrate independent movement relative to one another. This disconnected arrangement permits structural component (42) to move upward with the cable (41) and structural component (47) and associated striker plate (48) to move downward with the hook (46) when the hoist system is lifting a load. Such movement compresses the hook bumper (44) between structural component (42) and the striker plate (48).

As described herein, a load cell is positioned in a load path through the interface assembly. In some embodiments, for example, the load cell is positioned at the interface (50) of the striker plate (48) and hook bumper (44) for acquiring data related to the operation of the aircraft hoist system including loads experienced by the cable (41). Alternatively, in some embodiments, a load cell is positioned at the interface of the base plate (45) and hook bumper (44) for acquiring data related to the operation of the aircraft hoist system including loads experienced by the cable (41). Additionally, there are other possible locations for the load cell along the load path. For example, the load cell can also be posited between the cable (41) and structural component (42) as well as between structural component (47) and retainer (51).

The load cell can have any construction suitable for positioning between the striker plate (48) or base plate (45) and hook bumper (44) for acquisition of load data. In some embodiments, the load cell comprises a capacitive load comprising a load receiving surface and a capacitive assembly coupled to the load receiving surface, the capacitive assembly comprising parallel electrically conductive plates separated by a reversibly deformable spacer construction wherein the parallel plates comprise aligned apertures providing a passageway through the capacitive assembly for the hoist system cable. In some embodiments, a capacitive load cell can comprise any construction and/or properties recited in Section I hereinabove.

In one embodiment, for example, the capacitive load cell is sectioned into capacitive subassemblies. The capacitive subassemblies, in some embodiments, are operable to detect and account for off-axis or non-uniform cable loadings. Each capacitive subassembly, in some embodiments, is operable to provide an independent capacitance value resulting from a load applied to the cable of the hoist system. Off-axis or non-uniform loads can be detected and monitored when one or more of the capacitive subassemblies provide a value for capacitance differing from that of the remaining subassemblies in excess of a predetermined threshold.

Alternatively, in some embodiments, a load cell positioned between the striker plate and the hook bumper comprises one or more strain gauges for determining load applied to the cable. In some embodiments, for example, a ring is positioned between the striker plate and hook bumper wherein one or more strain gauges are coupled to the interior and/or exterior surfaces of the ring for measuring load transmitted through the ring body. The inner aperture of the ring provides a passageway for the cable of the hoist system through the load cell. A load cell incorporating one or more strain gauges can also comprise any of the data transmission and reception apparatus described herein for capacitive load cells.

Figure 5:
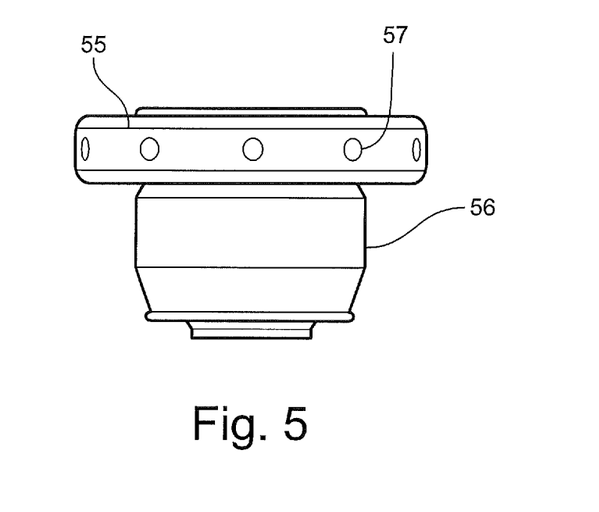
FIG. 5 illustrates an elevational view of a cable-hook interface assembly according to one embodiment described herein.

In some embodiments, a housing is provided around the interface of the striker plate with the hook bumper. The housing, in some embodiments, can accommodate wireless data transmission and reception apparatus, electrical power components and electronic memory of the load cell. FIG. 5 illustrates an elevational view of a cable-hook interface assembly according to one embodiment described herein. As illustrated in FIG. 5, a housing (55) encircles the interface of the hook bumper (56) with the striker plate. The housing (55) comprises a plurality of apertures (57) corresponding to wireless transceivers positioned within the housing for communication with the processing unit. A processing unit of an aircraft hoist system can have any construction and/or properties recited in Section II hereinabove.

Figure 6:
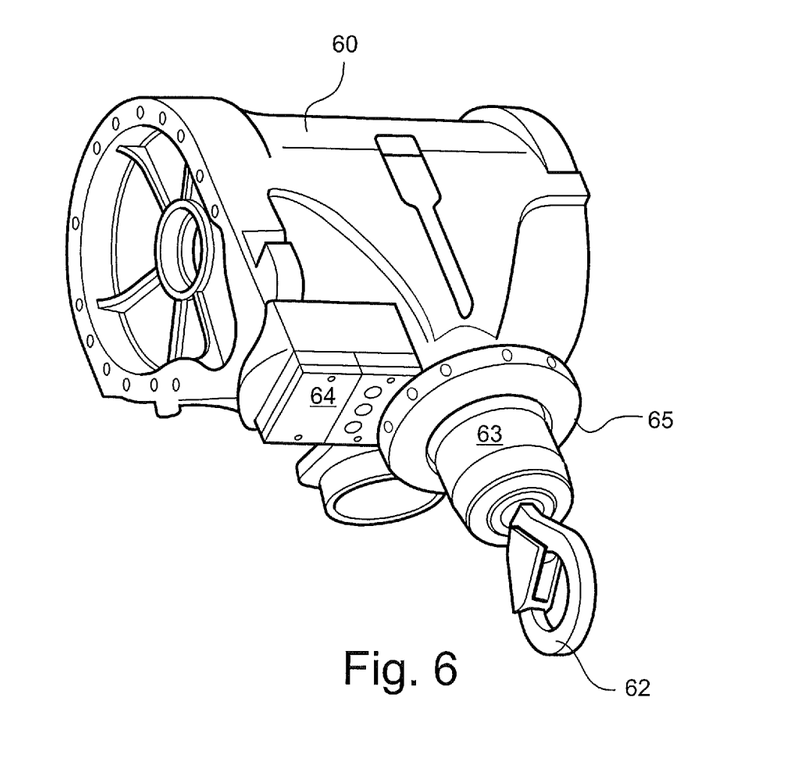
FIG. 6 illustrates a frame of an aircraft hoist system comprising a health and usage monitoring system according to one embodiment described herein.

FIG. 6 illustrates the frame of an aircraft hoist system comprising a health and usage monitoring system according to one embodiment described herein. A cable and 10 associated winding and unwinding apparatus are mounted to the hoist frame (60). A hook (62) is coupled to the cable by a cable-hook interface assembly (63). The cable-hook interface assembly (63) can have a construction as illustrated in FIG. 4, wherein a load cell (65) of the monitoring system is positioned between the hook bumper and striker plate or base plate. The processing unit (64) of the monitoring system is coupled to the housing of the cable winding and unwinding apparatus proximate the home position of the hook (62) and cable-hook interface assembly (63). The close spatial arrangement of the processing unit (64) and cable-hook interface assembly (63), in some embodiments, assists in wireless communication between the load cell (not shown) and the processing unit (64).

IV. Methods of Fitting a Health and Usage Monitoring System to an Aircraft Hoist In another aspect, methods of fitting a health and usage monitoring system to an aircraft hoist system are described herein. In some embodiments, a method of fitting a health and usage monitoring system to an aircraft hoist system comprises positioning a load cell in a load path through a cable-hook assembly of the aircraft hoist system. In some embodiments the load cell is positioned between a striker plate and hook bumper of a cable-hook assembly of the aircraft hoist system. A processing unit for communication with the load cell is provided and coupled to the aircraft hoist system. Alternatively, in some embodiments, the load cell is positioned between the base plate and hook bumper of the cable-hook assembly.

In some embodiments, the load cell is a capacitive load cell comprising a load receiving surface and a capacitive assembly coupled to the load receiving surface, the capacitive assembly comprising parallel electrically conductive plates separated by a reversibly deformable spacer construction wherein the parallel plates comprise aligned apertures providing a passageway through the capacitive assembly for the hoist system cable. A capacitive load cell of a health and usage monitoring system to be fit to an aircraft hoist can have any construction and/or properties described in Section I hereinabove. Further, in other embodiments, the load cell is a strain gauge load cell. In some embodiments, a strain gauge load cell can have a construction as provided in Section III hereinabove.

The load cell can be installed or retrofitted between the striker plate and the hook bumper by removing the striker plate. With the striker plate removed, the load cell can be seated on the hook bumper, and the striker plate is subsequently replaced. Alternatively, the hook bumper can be removed and the load cell placed adjacent to the striker plate or base plate. The hook bumper is subsequent replaced.

As illustrated in FIG. 6, the processing unit can be coupled to the housing of the cable winding an unwinding apparatus at a location to facilitate wireless communication between the processing unit and the load cell.

In some embodiments, the aircraft hoist system is an existing system, and the fitting is a retrofitting of the health and usage monitoring system to the aircraft hoist system. Health and monitoring systems described herein can be retrofitted to a variety of hoist systems including helicopter hoist systems. In some embodiments, the aircraft hoist system is new and fitting the health and usage monitoring system is administered as part of the manufacturing process of the new hoist system.

V. Methods of Monitoring Health and Usage of an Aircraft Hoist System

In a further aspect, methods of monitoring the health and usage of an aircraft hoist system are described herein. In some embodiments, a method of monitoring health and usage of an aircraft hoist system comprises measuring cable load with a load cell positioned in a load path through a cable-hook assembly of the aircraft hoist system. In some embodiments, the load cell is positioned between a striker plate and hook bumper in a cable-hook assembly.

In some embodiments, the load cell comprises a capacitive load cell comprising a load receiving surface and a capacitive assembly coupled to the load receiving surface, the capacitive assembly comprising parallel electrically conductive plates separated by a reversibly deformable spacer construction wherein the parallel plates comprise aligned apertures providing a passageway through the capacitive assembly for the hoist system cable. A capacitive load cell for use in the present method can comprise any construction and/or properties described in Section I hereinabove. In other embodiments, the load cell comprises an architecture comprising one or more strain gauges. A strain gauge load cell, in some embodiments, has an architecture as described in Section III hereinabove.

In some embodiments of a method of monitoring health and usage of a hoist system, the load cell is in a low power sleep mode until the cable-hook assembly departs from the home position. When the cable-hook assembly departs from the home position, the load cell is awaked from the sleep mode and prepared for acquisition of load data. The load cell can be awaked by a passive switch signaling the cable-hook has departed the home position. In some embodiments, the passive switch is a mechanical contact, such as a spring-loaded button, which disengages or alters position when the cable-hook assembly departs from the home position. Alternatively, in some embodiments, the passive switch can be an inductive switch such as that based on a magnetic field change when the cable-hook assembly departs from the home position. A magnet, for example, can be mounted on the hoist housing adjacent the home position, rendering a magnetic field change as the cable-hook departs to awake the load cell for data collection. Use of a passive switch can conserve energy of the load cell by obviating the need for the load cell to actively generate signals to determine spatial position for initiation of load data collection.

The load cell acquires load data experienced by the cable and hoist system while the cable-hook assembly is away from the home position. As the cable-hook assembly reaches or passes a predetermined proximity to the home position during retraction, data from a cable footage sensor can prompt the processing unit provide a signal to the load cell initiating transmission of the acquired load data to the processing unit. By employing the processing unit to provide an initial data transmission signal, the load cell does not expend energy generating signals to locate the processing unit. Moreover, employing the processing unit to provide an initial data transmission signal can further conserve energy of the load cell by precluding premature data transmission by the load cell when out of communication range with the processing unit. Once the transmission of load data from the load cell to the processing unit is complete, the load cell is returned to sleep mode. A potentiometer, in some embodiments, can be used as a cable footage sensor.

In other embodiments, the processing unit does not provide a signal to the load cell initiating transmission of the acquired load data to the processing unit. In one embodiment, for example, return of the cable-hook assembly to the home position initiates transmission of load data to the processing unit by the load cell. For example, one or more switches can be activated upon return of the cable-hook assembly to the home position, thereby prompting the load cell to begin load data transmission to the processing unit.

The processing unit receives the load data transmitted by the load cell and operates on the load data with one or more processors of the unit. In some embodiments, the load data comprises capacitance values provided by the capacitive load cell in response to one or more applied loads. The processor, in some embodiments, operates on the load data by assigning load values to the capacitance values. In some embodiments, the processor accesses one or more calibration charts for the capacitive load cell when assigning the load values.

In other embodiments, the load data comprises resistivity changes in a circuit according to a load cell incorporating strain gauges. The processor, in some embodiments, operates on the load data by assigning load values to the resistivity values. In some embodiments, the processor accesses one or more calibration charts for the load cell when assigning the load values.

The processed load data can be output to an end user for monitoring the health and usage of the aircraft hoist system. The processing unit can comprise one or more interfaces for communication of the load data to an end user.

Various embodiments of the invention have been described in fulfillment of the various objects of the invention. It should be recognized that these embodiments are merely illustrative of the principles of the present invention. Numerous modifications and adaptations thereof will be readily apparent to those skilled in the art without departing from the spirit and scope of the invention.

That which is claimed is:

1. A health and usage monitoring system for an aircraft hoist system, comprising:
a capacitive load cell comprising a load receiving surface and a capacitive assembly coupled to the load receiving surface, the capacitive assembly comprising parallel electrically conductive plates separated by a reversibly deformable spacer construction, wherein the parallel plates comprise aligned apertures providing a passageway through the capacitive load cell for a hoist system cable; and a processing unit for communication with the capacitive load cell, wherein the reversibly deformable spacer construction has an elastic modulus rendering a change in spacing of the parallel electrically conductive plates under an applied load in a first load range resulting in a measurable change in capacitance of the capacitive assembly, wherein the load cell is positioned between a striker plate and a hook bumper of an interface assembly for the aircraft hoist system.

2. The health and usage monitoring system of claim 1, wherein the capacitive load cell comprises apparatus for recording data related to load measured by the capacitive load cell.

3. The health and usage monitoring system of claim 2, wherein the capacitive load cell comprises wireless data transmission and reception apparatus.

4. The health and usage monitoring system of claim 3, wherein the wireless data transmission and reception apparatus are responsive to signals in the visible or infrared region of the electromagnetic spectrum.

5. The health and usage monitoring system of claim 3, wherein the wireless data transmission and reception apparatus are responsive to signals in the radio frequency region of the electromagnetic spectrum.

6. The health and usage monitoring system of claim 3, wherein the wireless data transmission and reception apparatus comprise a plurality of transceivers.

7. The health and usage monitoring system of claim 3, wherein the processing unit comprises a wireless data transmission and reception apparatus.

8. The health and usage monitoring system of claim 1, wherein the processing unit comprises one more interfaces for communication with an end user or a sensor of the aircraft hoist system.

9. The health and usage monitoring system of claim 1, wherein the processing unit comprises data storage apparatus.

10. The health and usage monitoring system of claim 1, wherein the processing unit comprises a processor for operating on data received from the capacitive load cell.

11. The health and usage monitoring system of claim 1, further comprising a cable footage sensor in communication with the processing unit.

12. The health and usage monitoring system of claim 1, wherein the processing unit is powered by electrical power applied to the hoist system.

13. The health and usage monitoring system of claim 1, wherein the first load range is from about 10 pounds to 2500 pounds.

14. The health and usage monitoring system of claim 1, wherein the first load range is greater than 2500 pounds.

15. The health and usage monitoring system of claim 1, wherein the reversibly deformable spacer construction comprises a dielectric material positioned between the parallel plates.

16. The health and usage monitoring system of claim 15, wherein the dielectric material comprises an aperture aligned with the apertures of the parallel plates.

17. The health and usage monitoring system of claim 16, wherein the dielectric material comprises a polymeric material or ceramic material.

18. The health and usage monitoring system of claim 1, wherein the reversibly deformable spacer construction comprises one or more springs positioned between the parallel plates.

19. The health and usage monitoring system of claim 1, wherein the parallel plates comprise a printed circuit board substrate having an electrically conductive film deposited thereon.

20. An aircraft hoist system, comprising:

a cable coupled to a cable winding and unwinding apparatus;

a hook coupled to the cable through an interface assembly, the interface assembly comprising a hook bumper and a striker plate; and a health and use monitoring system comprising a load cell and a processing unit for communication with the load cell, wherein the load cell is a capacitive load cell positioned in a load path through the interface assembly and comprising a load receiving surface and a capacitive assembly coupled to the load receiving surface, the capacitive assembly comprising parallel electrically conductive plates separated by a reversibly deformable spacer construction wherein the parallel plates comprise aligned apertures providing a passageway through the capacitive assembly for the cable, wherein the reversibly deformable spacer construction has an elastic modulus rendering a change in spacing of the parallel electrically conductive plates under an applied load in a first load range resulting in a measurable change in capacitance of the capacitive assembly, wherein the load cell is positioned between the striker plate and the hook bumper of the interface assembly for the aircraft hoist system.

21. The aircraft hoist system as recited in claim 20, wherein the capacitive load cell is positioned between the striker plate and the hook bumper of the interface assembly of the cable hook assembly surrounding an end of the cable opposite the cable winding apparatus.

22. A method of fitting a health and usage monitoring system to an aircraft hoist system, comprising:

positioning a load cell in a load path through a cable-hook assembly of the aircraft hoist system;

providing a processing unit for communication with the load cell; and coupling the processing unit to the aircraft hoist system;

wherein the load cell includes a capacitive load cell comprising a load receiving surface and a capacitive assembly coupled to the load receiving surface, the capacitive assembly comprising parallel electrically conductive plates separated by a reversibly deformable spacer construction wherein the parallel plates comprise aligned apertures providing a passageway through the capacitive assembly for a cable of the aircraft hoist system, wherein the reversibly deformable spacer construction has an elastic modulus rendering a change in spacing of the parallel electrically conductive plates under an applied load in a first load range resulting in a measurable chance in capacitance of the capacitive assembly, wherein the load cell is positioned between a striker plate and a hook bumper of the cable-hook assembly.

23. The method of claim 22, wherein the processing unit is coupled to the aircraft hoist system in a position for line of sight wireless communication with the load cell.

24. The method of claim 22, wherein the reversibly deformable spacer construction has an elastic modulus rendering a change in spacing of the parallel electrically conductive plates under an applied load in a first load range resulting in a measurable change in capacitance of the capacitive assembly.

25. The method of claim 22, wherein the aircraft hoist system is an existing aircraft hoist system and the fitting is a retrofitting of the health and use monitoring system to the existing aircraft hoist system.

26. The method of claim 24, wherein the striker plate is removed for positioning the load cell adjacent the hook bumper, and the striker plate is subsequently replaced.

27. The method of claim 24, wherein the hook bumper is removed for positioning the load cell adjacent the striker plate, and the hook bumper is subsequently replaced.

28. The method as recited in claim 22, wherein positioning the capacitive load cell includes positioning the capacitive load cell between the striker plate and the hook bumper of an interface assembly of the cable-hook assembly surrounding an end of the cable received within the interface assembly.

* * * * *